United States Patent [19]

White

[11] 4,137,625
[45] Feb. 6, 1979

[54] THIN FILM INTERCONNECT FOR MULTICOLOR IR/CCD

[75] Inventor: William J. White, Chelmsford, Mass.

[73] Assignee: Honeywell Inc., Minneapolis, Minn.

[21] Appl. No.: 829,744

[22] Filed: Sep. 1, 1977

[51] Int. Cl.² ............................................. B01J 17/00
[52] U.S. Cl. .................................. 29/577 C; 29/580; 29/589
[58] Field of Search ................. 29/577, 580, 589, 625, 29/626

[56] References Cited

U.S. PATENT DOCUMENTS

| | | | |
|---|---|---|---|
| 3,481,777 | 12/1969 | Spannhake | 29/625 |
| 3,805,375 | 4/1974 | La Combe | 29/577 |
| 3,961,414 | 6/1976 | Humphreys | 29/577 |

Primary Examiner—W. Tupman
Attorney, Agent, or Firm—Theodore F. Neils; David R. Fairbairn

[57] ABSTRACT

A hybrid mosaic IR/CCD focal plane structure is fabricated using planar thin film interconnects. Rows of detectors are formed on an integrated circuit substrate so that the rows of detectors are adjacent to rows of electrical contacts on the integrated circuit. Contact pads are plated onto the rows of contacts and the regions between adjacent rows of detectors are backfilled with an insulating material. The insulating material is then lapped to expose the contact pads and to form an essentially coplanar surface with the detectors. Thin film interconnects are formed over the coplanar surface between the exposed contact pads and detectors in the adjacent row.

14 Claims, 9 Drawing Figures

THIN FILM INTERCONNECT FOR MULTICOLOR IR/CCD

REFERENCE TO CO-PENDING APPLICATIONS

Reference is hereby made to co-pending applications by R. W. Lorenze, Jr. and W. J. White, Ser. No. 829,745, entitled "Hybrid Mosaic IR/CCD Focal Plane" and by R. V. Lorenze, Jr., Ser. No. 829,746 entitled "Durable Insulating Protective Layer for Hybrid CCD/Mosaic IR Detector Array," which were filed on even date with the present application and which are assigned to same assignee as the present application. Both co-pending applications disclose but do not claim the thin film interconnect method and construction which is specifically disclosed and claimed in the present application.

BACKGROUND OF THE INVENTION

The present invention relates to electromagnetic radiation sensor systems. In particular, the present invention relates to improved electrical interconnections for use in hybrid infrared focal planes.

Previous designs of cryogenically cooled infrared focal planes can be characterized by a limited number of photodetector elements, an absence of preamplifiers or other signal processing elements, and a large complement of signal leads. Preamplification and other signal processing is carried out external to the Dewar. The complexity of the focal planes has been limited by the number of signal leads which can be routed from inside the Dewar, through vacuum seals, to the associated electronics outside of the Dewar.

Recent developments in semiconductor technology have led to the feasibility of more complex infrared system focal planes, with more sensitivity, higher resolution, higher data rates and greater reliability. These developments include advances in microelectronics, especially in charge transfer devices, MOS technology, and large scale integration.

The advent of charge transfer devices and their supporting technology introduces several major benefits. First, it is now possible to consider carrying out a variety of signal processing tasks in situ on or near the focal plane. Second, the multiplexing capability of charge transfer devices permits a dramatic reduction in the number of leads leaving the focal plane.

The intergration of infrared detectors and integrated circuit signal processors on the focal plane, therefore, reduces the number of electrical feedthroughs and decreases the system complexity. Higher system performance becomes possible, along with considerable reduction in overall cost. An example of a proposed infrared detector/integrated circuit focal plane is shown in U.S. Pat. No. 3,883,437 by K. Nummedal et al.

The development of hybrid focal planes containing both infrared detectors and associated signal processing, however, presents several technical challenges. First, the typical infrared detector materials are mercury cadmium telluride, lead tin telluride, lead selenide telluride, and indium antimonide. The signal processing portions of the hybrid focal plane, however, will typically be silicon because the silicon technology is far more advanced than those of the typical infrared detector materials. In addition, the larger bandgap of silicon provides certain advantages over the narrower bandgaps of the typical infrared detector materials. The design of a hybrid focal plane, therefore, must accommodate infrared detectors and signal processors which are formed from different semiconductor materials.

Second, it is highly desirable to provide very high packing density of photodetectors on the focal plane. This complicates the interconnections of the photodetectors to the associated signal processing circuitry.

Third, since the photodetectors and the signal processing circuitry will be processed at different times, it is important that the processing of the infrared detectors does not adversely affect previously formed solid state signal processing circuitry, or vice versa.

From both a reliability and an ease of fabrication standpoint, any electrical interconnection used with a hybrid mosaic IR/CCD focal plane should use some form of thin film metalization. The soldering or welding of individual wires from contacts on the integrated circuit to individual detectors is not suitable for a hybrid mosaic IR/CCD focal plane.

One form of interconnect which has been suggested for use in hybrid mosaic IR/CCD focal planes is shown in FIG. 1 of the two previously mentioned co-pending patent applications. This interconnect involves the formation of a totally evaporated lead from a contact pad over a beveled side of a detector, and onto the top of the detector. A detailed description of the fabrication techniques used in producing totally evaporated leads of this type is also found in co-pending U.S. Patent Applications by R. V. Lorenze, Jr. and M. F. Young, Ser. Nos. 720,917 and 720,918, entitled "Method of Preparing Photodetector Array Elements" and "Photodetector Array Delineation Method," filed Sept. 9, 1976 and assigned to the same assignee as the present application.

The fabrication techniques described in the previously mentioned patent applications have been used successfully to produce multielement high performance linear arrays with totally evaporated leads for applications (e.g. FLIRs) in which high reliability and cost effective fabrication are required. For hybrid mosaic array applications, however, where close spacing of detector elements is necessary, the beveling process uses up valuable space and may induce damage in adjacent rows of detectors.

Another form of thin film interconnect is shown in U.S. Pat. No. 3,965,568 by R. W. Gooch. In the Gooch patent, a thin film lead is deposited across a planar surface to make contact to a detector. While the method of the Gooch patent appears to be useful in the formation of linear arrays of infrared detectors, it does not appear to be particularly well suited for two-dimensional detector arrays, in which detectors are arranged in rows and columns.

SUMMARY OF THE INVENTION

The present invention is an improved method of fabricating mosaic detector arrays which utilizes an improved electrical interconnection. Although the method may be used with any hybrid IR/CCD structure, it is particularly advantageous in fabricating multicolor hybrid IR/CCD structures.

In the method of the present invention, a detector array is fabricated on a substrate which preferably is an integrated circuit containing signal processing circuitry for processing signals from the detector array. The substrate has rows of electrical contacts to various portions of the signal processing circuitry.

A body of detector material is attached to the surface of the substrate. Portions of the body are then removed to expose the rows of electrical contacts and to form a row of detector material adjacent to each row of contacts. A plurality of individual detectors is formed in each row of detector material.

Contact pads are then formed on top of the exposed electrical contacts. The regions between the rows of detector material are backfilled with an insulating material, and the insulating material is lapped to form an essentially coplanar surface with the rows of detectors. Thin film interconnects are then formed which extend over the coplanar surface from the contact pads, which are exposed at the coplanar surface, to individual detectors in the adjacent row of detectors.

DETAILED DESCRIPTION OF THE PREFERRED EMBODIMENTS

The method of the present invention is a highly advantageous technique for fabricating hybrid IR/CCD mosaic detector systems. It is particularly useful in fabricating a multicolor hybrid detector system in which detectors having different wavelength sensitivities are stacked in piggy-back fashion on top of one another and in which the integrated circuit which forms the detector substrate contains signal processing circuitry for all of the detectors.

FIGS. 1a–1h illustrate the method of the present invention in fabricating the first layer of a three-layer, three-color detector array. The steps illustrated in FIGS. 1a–1h are repeated in fabricating subsequent layers. FIG. 2 shows a three-color IR/CCD hybrid focal plane which has been fabricated using the method of the present invention, as illustrated in FIGS. 1a–1h.

Figure 1A:
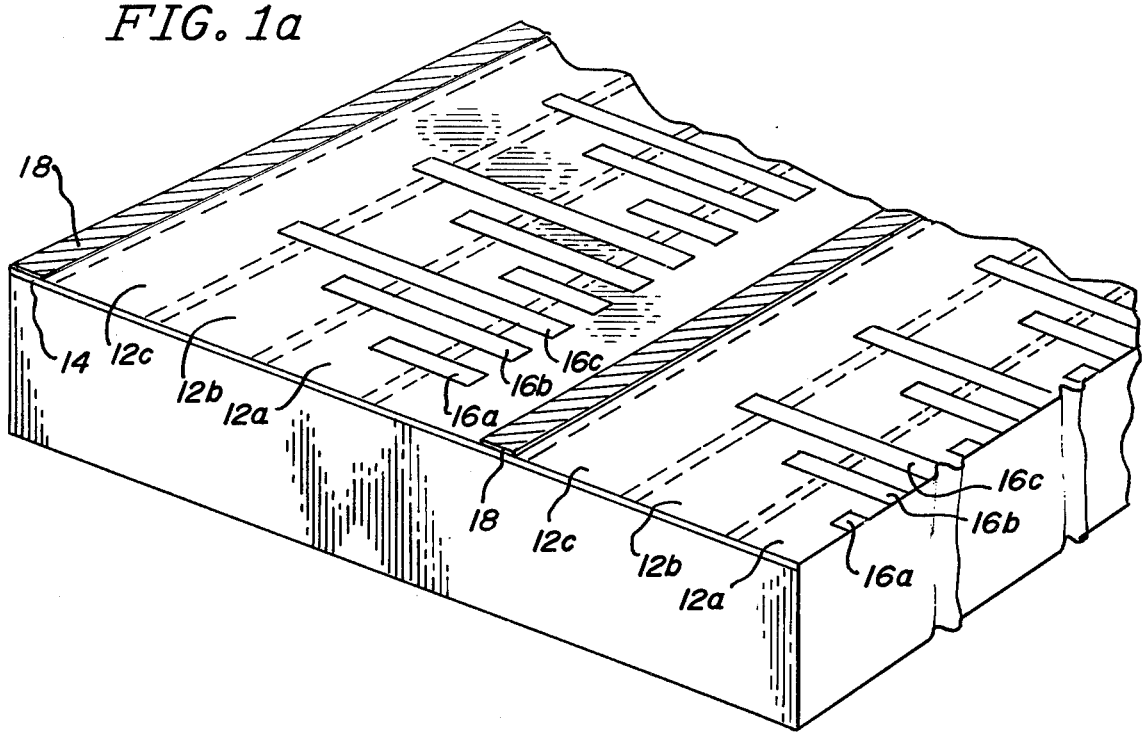
FIGS. 1a–1h illustrate the formation of hybrid IR/CCD mosaic focal plane structure using the method of the present invention.
Figure 2:
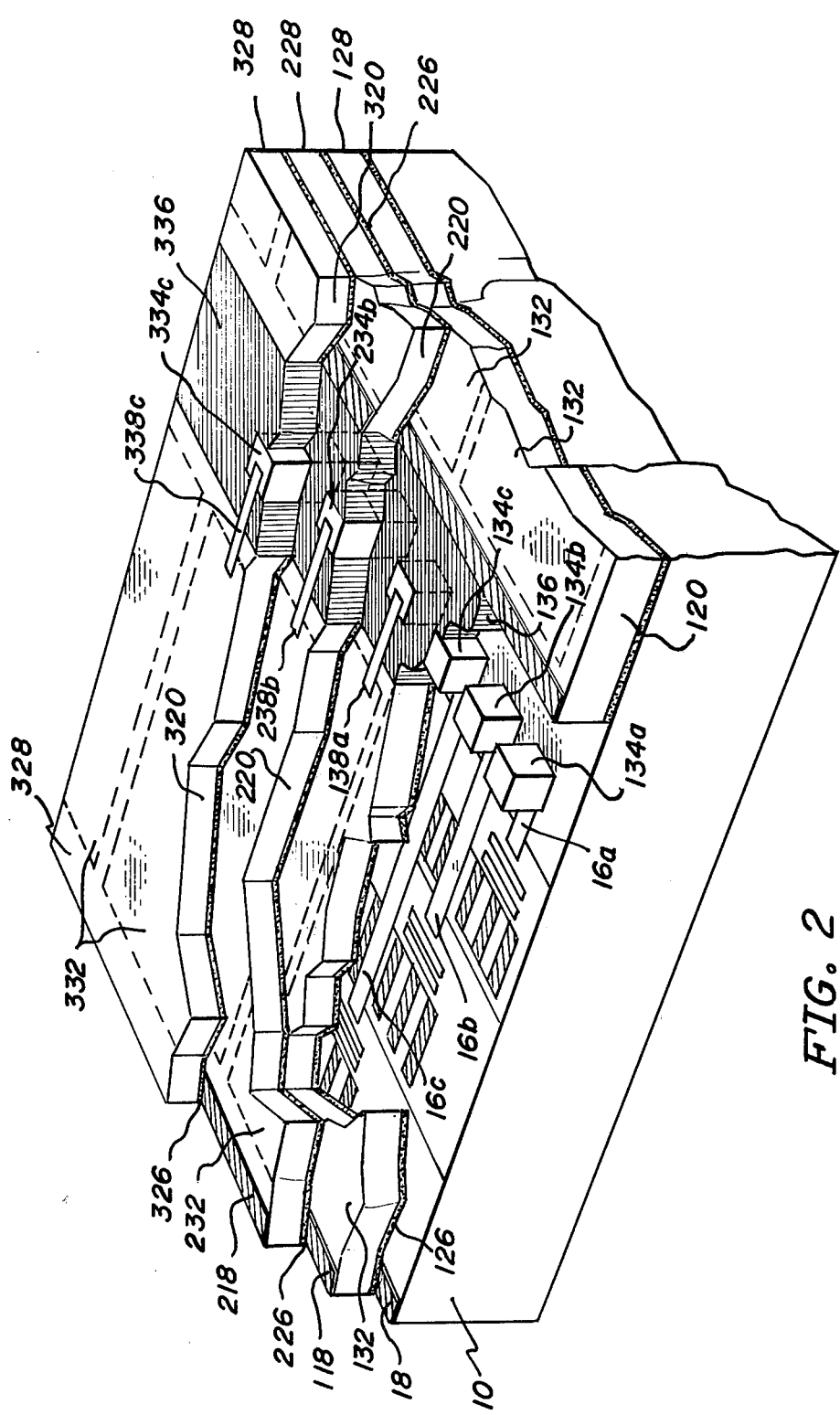
FIG. 2 shows a three-color hybrid IR/CCD device fabricated by the method of the present invention.

FIG. 1a shows silicon integrated circuit substrate 10, which contains signal processing circuitry used to process the signals from the detectors of the multicolor mosaic detector array. In the embodiment shown in FIG. 1a, substrate 10 includes three parallel CCD shift registers 12a, 12b, and 12c for each row of detectors. The surface of integrated circuit substrate 10 is covered by the standard silicon dioxide passivation layer 14.

Thin film source contacts 16a, 16b, and 16c are connected to cource diffusion inputs to shift registers 12a, 12b, and 12c— respectively. Photosignals from the three layers of detectors will be supplied to source contacts 16a, 16b, and 16c, and, therefore, to the source inputs of shift registers 12a, 12b, and 12c.

Also shown in FIG. 1a are thin film back side contacts 18. Each back side contact 18 will form a common contact for all detectors in a row.

The outputs of shift registers 12a, 12b, and 12c are, in a preferred embodiment, combined by a triple multiplexer (not shown) in integrated circuit substrate 10. In an alternative embodiment, a single shift register with wider dynamic range than shift registers 12a, 12b, and 12c may be used so that the signals from the three levels of detectors are read out serially from adjacent buckets of the single shift register. In this case, the triple multiplexer is not required, and source contacts 16a, 16b, and 16c will be of equal length.

Figure 1B:
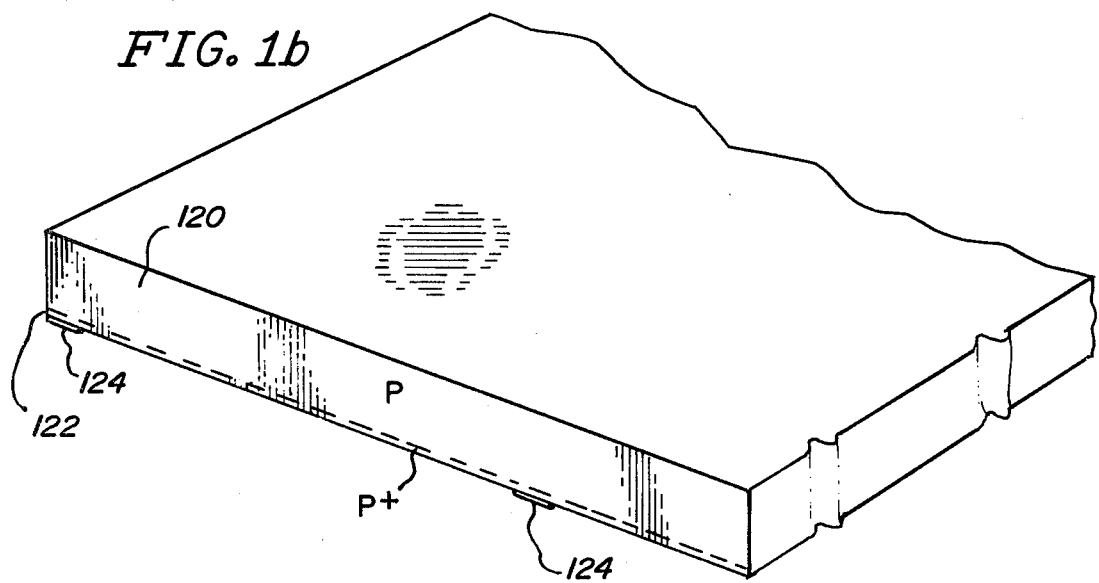

In FIG. 1b, a body 120 of infrared detector material is shown. In a preferred embodiment, body 120 is a p type body of (Hg,Cd)Te. Body 120 is selected using nondestructive test techniques, and one side is lapped and chemically polished according to standard processing procedures. The processed back surface is then ion implanted with an acceptor ion species (e.g. a column Vb ion such as As, P, or Sb) and subjected to an elevated temperature anneal to form a p+ layer 122. Thin film metalizations 124 are then deposited on the back surface to form ohmic contact to p+ layer 122. Metalizations 124 are positioned so that they will be aligned with back side contacts 18 shown in FIG. 1a.

When a multicolor detector system is being fabricated, body 120 is the infrared detector material having the longest wavelength response. When (Hg,Cd)Te is the infrared detector material, body 120 has the lowest mole fraction of CdTe of any of the materials used in the multicolor detector system.

Figure 1C:
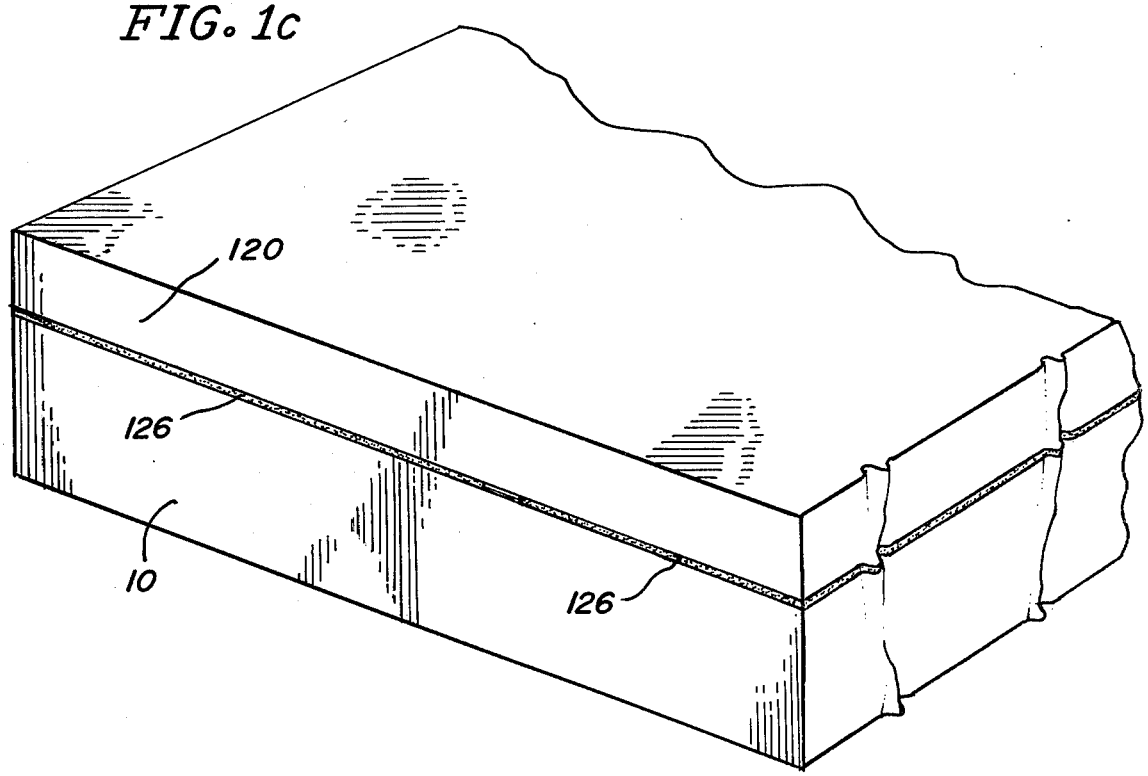

As shown in FIG. 1c, body 120 is then bonded to substrate 10 using a non-conductive, infrared transmitting epoxy 126. Because interconnection between back side contacts 18 on substrate 10 and metalizations 124 on body 120 must be made, special metal bumps may be plated on either metalization 18 or metalization 124 which will project through epoxy 126. Alternatively, a small amount of conductive epoxy may be used near the ends of back side contacts 18 and metalizations 124 to provide electrical connection.

After (Hg,Cd)Te body 120 has been bonded to integrated circuit substrate 10, front side preparation of body 120 begins. (Hg,Cd)Te body 120 is lapped and etched from its initial thickness of approximately 1 mm to a final thickness of approximately 10 to 12 microns.

Figure 1D:
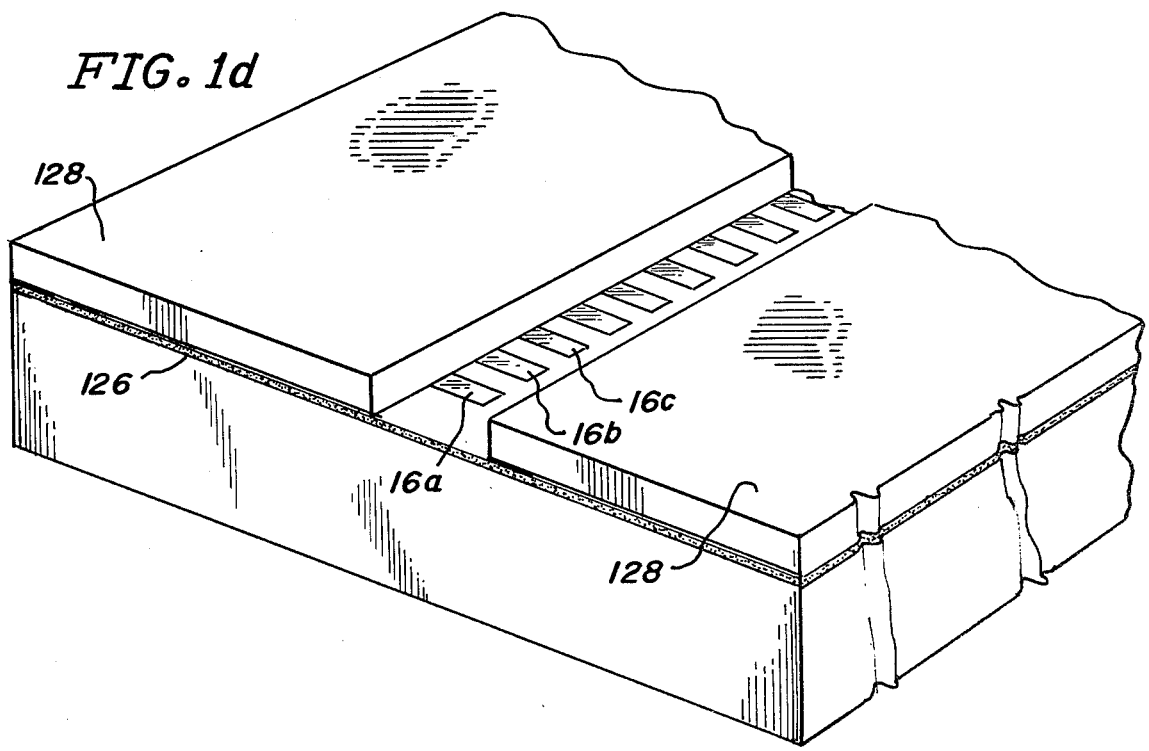

A photoresist pattern is then applied to the top surface of (Hg,Cd)Te body 120, and (Hg,Cd)Te body 120 is spray-etched delineated to produce rows 128 of rectangular shaped (Hg,Cd)Te as shown in FIG. 1d. With the photoresist mask still in place, a low pressure air abrasion tool is used to erode away the exposed portions of epoxy layer 126 to expose source contacts 16a, 16b, and 16c.

After the (Hg,Cd)Te body 120 and epoxy 126 have been delineated, the (Hg,Cd)Te is given a final chemical etch to remove surface damage, and the entire array is blanket-coated with an approximately 1000Å thickness film of a dielectric passivation material such as ZnS. Passivation layer 130 is shown in FIG. 1e.

The structure is then ready for formation of a pn junction by ion implantation. Since (Hg,Cd)Te body 120 is p type, the formation of pn junctions involves implanation of donor ion such as Cl, Br, F, I, Al, or Si to form n type regions 132. In the preferred embodiments, the donor ions are implanted through a photoresist (or permanent insulator) mask such that the regions of (Hg,Cd)Te not covered by the mask (i.e. the square areas delineated by a dashed lines in FIG. 1e) are implanted while the mask covered regions are not. The energy of the ions is such that the ions cannot penetrate the relatively thick mask layer, but can pass through the thin ZnS passivation layer 130 to enter the (Hg,Cd)Te body. When Cl ions are utilized as the donor ion species, a subsequent anneal at 200 to 300° relieves implant damage and activates the Cl impurities to form an n type region 132 near the surface of p type bulk 120, thereby producing a pn junction photodiode.

Figure 1E:
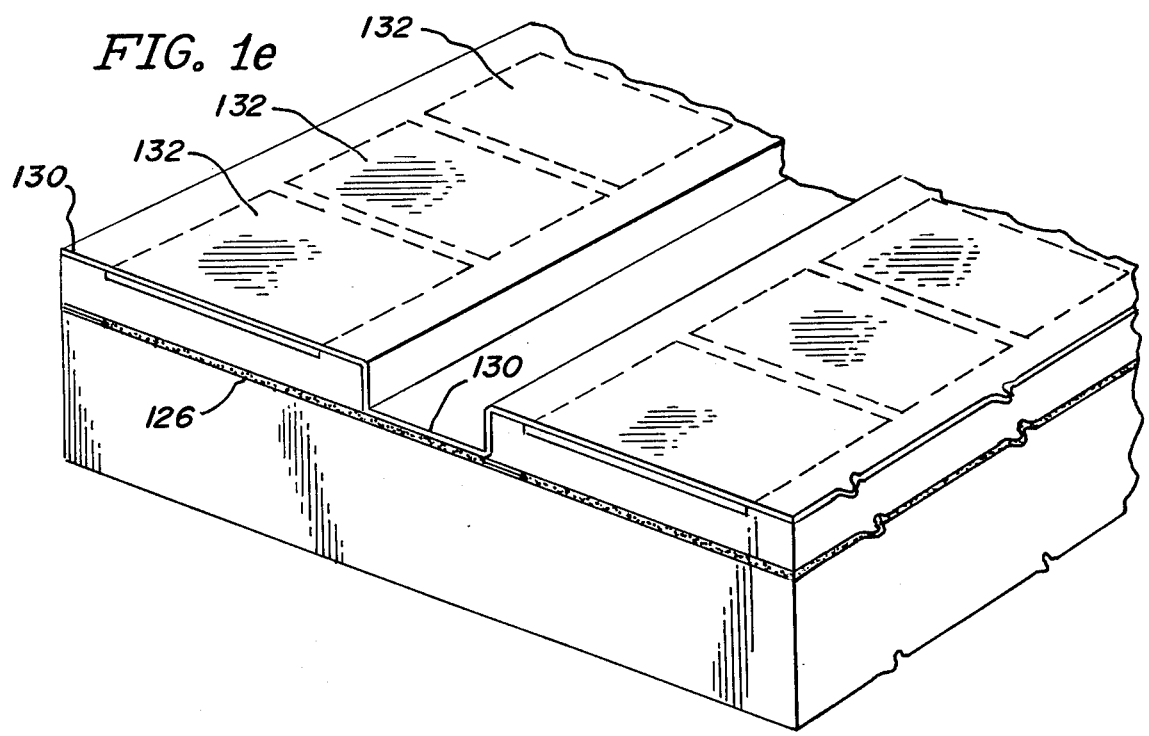

At the stage of array fabrication shown in FIG. 1e, rows of detector elements have been delineated mechanically by physical removal of material (i.e. by spray etching and air abrasion) while columns of detector elements have been delineated electrically by junction ion implantation. Each row 128 of detector elements has a common back side metalization 124 which is connected to a back side contact 18 on integrated circuit substrate 10.

Figure 1F:
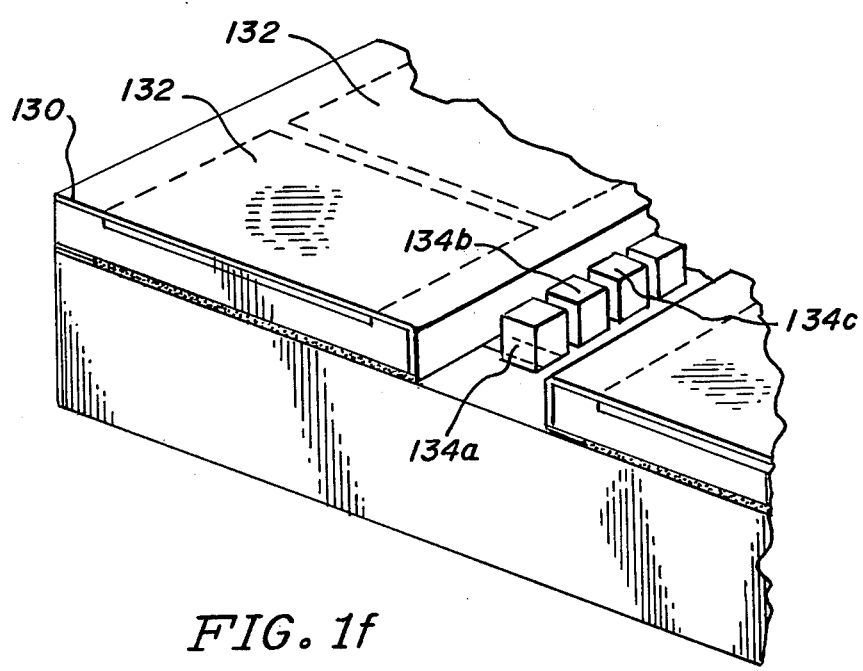
Figure 1G:
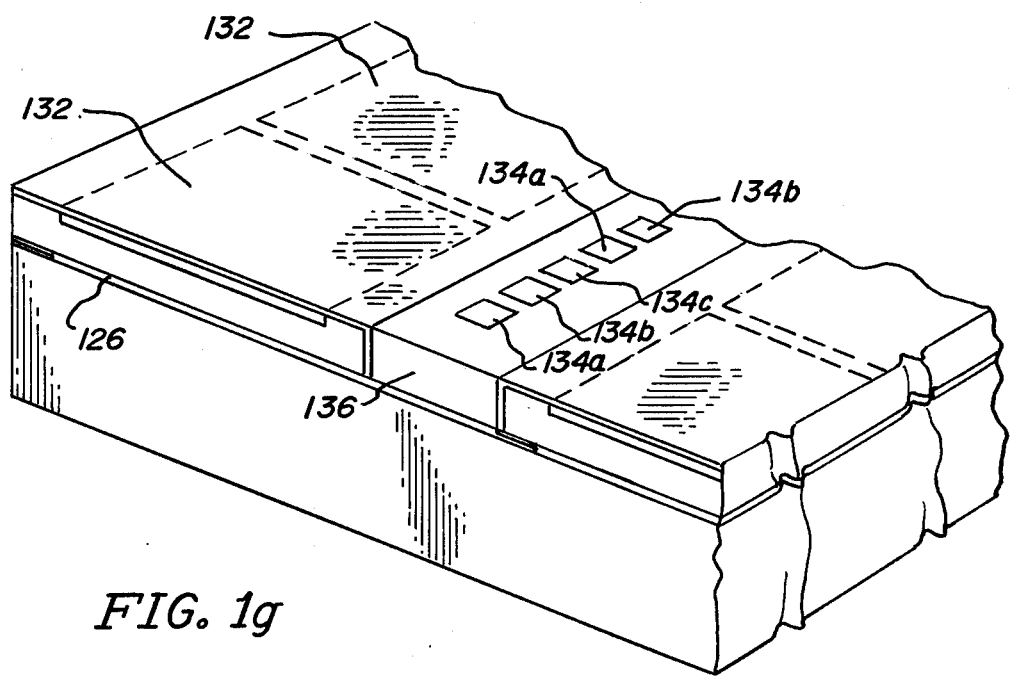
Figure 1H:
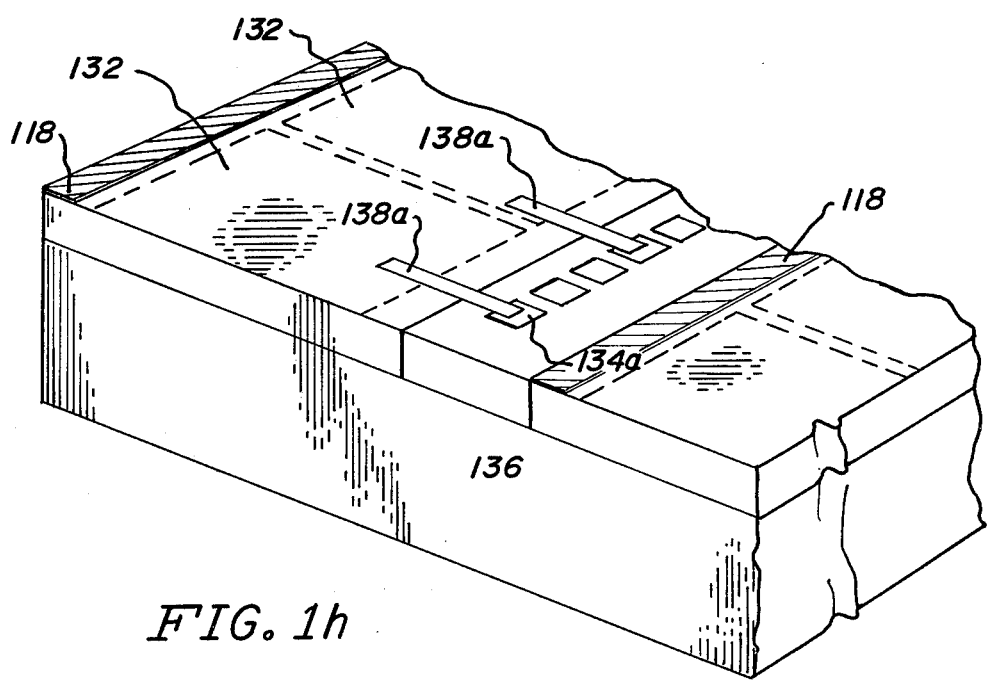

The next stage, as illustrated in FIGS. 1f-1h, is to interconnect the individual n type regions 132 to corresponding source contacts 16a. This front side interconnection begins by the removal of passivation layer 30 in the regions between rows 128 so that source contacts 16a, 16b, and 16c are exposed. First level contact pads are then plated up on source contacts 16a, 16b, and 16c so that they extend at least to the top surface of rows 128. FIG. 1f shows the contact pads 134a, 134b, and 134c formed by the plating up process. Contact pads 134a, 134b, and 134c may be formed using photolithographic masking and metal electrical plating techniques. Preferred materials for contact pads 134a–134c include gold and nickel, which may be easily plated using standard plating techniques.

The next step in the process is the backfilling of the regions between adjacent rows 128 with an inert material 136. In a preferred embodiment, inert material 136 is an adhesive insulator material such as nonconductive epoxy. The epoxy then lapped down to expose plated up contact pads 134a–134c and to form an essentially coplanar surface with the top surface of rows 128. Rows 128 may be considered a lapping stop so that the lapping is ended as soon as the top surface of passivation layer 130 on rows 128 is encountered during lapping. FIG. 1g shows the structure after lapping has been completed.

FIG. 1h illustrates the final steps of the process required for interconnection to the first layer of detectors. Holes are opened up in passivation layer 130 over each n type region 132, and thin film metal interconnects 138a are deposited over the coplanar surface from the holes to corresponding contact pads 134a. Photo signals from regions 132a, therefore, are supplied through interconnects 138a, contact pads 134a, and source contacts 16a, to the source inputs of shift register 12a.

If only a single layer of detectors is required, the process is completed except for an optional antireflection coating. In that case, shift registers 12b and 12c, source contacts 16b and 16c, and contact pads 134b and 134c are unnecessary.

If, on the other hand, a multicolor detector mosaic is to be fabricated, back side contact 118 is provided along the rear edge of rows 128. Back side contacts 118 contacts p type bulk 120 through an opening in passivation layer 130. In addition, back side contacts 118 provide back side contact to the next layer of detectors, just as layer 18 on substrate 10 provides back side contact to body 120.

FIG. 2 shows a three-color hybrid IR/CCD device fabricated using the method of the present invention. In order to produce the second and third levels of detectors, the steps shown in FIGS. 1b-1h are repeated.

As shown in FIG. 2, generally similar reference numbers and letters have been utilized to designate elements in the second and third layers which are similar to elements in the first layer. While elements in the first layer range from reference number 118 to reference number 138a, similar elements in the second layer range from reference number 218 to 238b, and similar elements of the third layer range from 320 to 338c.

The detectors of rows 228 are positioned immediately above the corresponding detectors in rows 128. Similarly, the detectors of rows 328 are positioned immediately above the corresponding detectors of rows 228 and 128. Body 120 is the longest wavelength detector material, while body 320 is the shortest wavelength detector material.

Photosignals from n type regions 232 of the second level detectors are supplied to shift register 12b through second level thin film interconnects 238b, second level contact pads 234b, and first level contact pads 134b, and source contacts 16b. Similarly, photosignals from n type regions 232 of the third level detectors are supplied to shift register 12c through third level thin film interconnect 338c, third level contact pads 334c, second level contact pads 234c, first level contact pads 134c, and metalization 16c.

Back side contacts 18, 118 and 218 provide interconnection of the p type regions of all three detector levels. All of the detectors in each row, therefore, have a common back side contact.

It can be seen that the present invention is particularly advantageous in the fabrication of multicolor hybrid IR/CCD devices. Each level of detectors present an essentially planar surface on which the next level of detectors can be fabricated. The fabrication itself is performed using cost effective planar processing techniques. Manual steps, such as wire bonding to provide connections to the detectors, are eliminated.

In conclusion, the present invention is a highly advantageous method of fabricating hybrid IR/CCD mosaic focal planes. Although the present invention has been described with reference to preferred embodiments, workers skilled in the art will recognize that changes may be made in form and detail without departing from the spirit and scope of the invention. For example, although the present invention has shown detectors being attached to the standard passivation layer of an integrated circuit substrate, the special protective layer described in the previously mentioned co-pending application by R. V. Lorenze, Jr. may be used with essentially no other changes to the method of the present invention.

THE EMBODIMENTS OF THE INVENTION IN WHICH AN EXCLUSIVE PROPERTY OR RIGHT IS CLAIMED ARE DEFINED AS FOLLOWS:

1. A method of forming a detector array on a substrate, the method comprising:
providing a substrate having a first surface with a plurality of rows of electrical contacts thereon;
attaching a body of first detector material to the first surface;
removing portions of the body to form a plurality of rows of first detector material, each row of first detector material being adjacent a row of electrical contacts;
forming a plurality of individual detectors in each row of first detector material;
exposing the rows of electrical contacts;
forming rows of first level contact pads on the rows of electrical contacts, the first level contact pads extending above the first surface by a distance at least equal to the thickness of the detectors;
backfilling regions between rows of first detector material with a first insulating material;
removing portions of the first insulating material to form an essentially coplanar second surface with the rows of first detector material, the second surface having the first level contact pads exposed; and forming thin film interconnects over the second surface between the plurality of individual detectors and first level contact pads in an adjacent row.

2. The method of claim 1 wherein the substrate is a semiconductor integrated circuit having signal processing circuitry therein.

3. The method of claim 2 wherein the electrical contacts are connected to the signal processing circuitry.

4. The method of claim 1 wherein removing portions of the first insulating material comprises lapping.

5. The method of claim 4 wherein the first insulating material is a non-conductive epoxy.

6. The method of claim 1 wherein attaching the body of first detector material is with an insulating adhesive material.

7. The method of claim 6 wherein removing portions of the body includes removing portions of the insulating adhesive material to expose the rows of electrical contacts adjacent the rows of first detector material.

8. The method of claim 1 wherein the first detector material has a first conductivity type and wherein forming a plurality of individual detectors in each row comprises forming a plurality of separated regions of second conductivity type in each row of first detector material.

9. The method of claim 8 wherein forming a plurality of separated regions of second conductivity type comprises:
depositing a passivation layer over the rows of first detector material; and
forming the separated regions of second conductivity type by ion implantation.

10. The method of claim 9 wherein exposing the rows of electrical contacts comprises:
removing portions of the passivation layer over the rows of electrical contacts to expose the rows of electrical contacts.

11. The method of claim 1 and further comprising:
attaching a body of second detector material to the second surface;
removing portions of the body of second detector material to form rows of second detector material positioned essentially above the rows of first detector material, each row of second detector material being adjacent a row of first level contact pads;
forming a plurality of individual detectors in each row of second detector material positioned essentially above the individual detectors in each row of first detector material;
forming a second level contact pads on first level contact pads in each row which are not interconnected to an individual detector in a row of first detector material, the second level contact pads extending above the second surface by a distance at least equal to the thickness of the detectors in each row of second detector material;
backfilling regions between rows of second detector material with a second insulating material;
removing portions of the second insulating material to form an essentially coplanar third surface with the rows of second detector material, the third surface having the second level contact pads exposed; and
forming thin film interconnects over the third surface between the plurality of individual detectors and second level contact pads in an adjacent row.

12. The method of claim 11 and further comprising:
attaching a body of third detector material to the third surface;
removing portions of the body of third detector material to form rows of third detector material positioned essentially above the rows of second and first detector material, each row of third detector material being adjacent a row of second level contact pads;
forming a plurality of individual detectors in each row of third detector material positioned essentially above the individual detectors in each row of first detector material and each row of second detector material;
forming third level contact pads on second level contact pads in each row which are not interconnected to an individual detector in a row of second detector material, the third level contact pads extending above the third surface by a distance at least equal to the thickness of the detectors in each row of third detector material;
backfilling regions between rows of third detector material with an insulating material;
removing portions of the insulating material to form an essentially coplanar fourth surface with the third level contact pads exposed; and
forming thin film interconnects over the fourth surface between the plurality of individual detectors and third level contact pads in an adjacent row.

13. A method of forming a photodetector system, the method comprising:
providing a semiconductor substrate having signal processing circuitry formed therein proximate a first surface and having rows of contacts exposed to provide electrical contact to the signal processing circuitry;
attaching a body of first conductivity type photodetector material to the first surface;
removing portions of the body to form rows of photodetector material adjacent each row of contacts;
forming a plurality of separated regions of second conductivity type in each row of photodetector material;
forming contact pads on the contacts, the contact pads extending above the first surface by a distance at least equal to the thickness of the rows of photodetector material;
backfilling regions between rows of photodetector material with an insulating material;
lapping the insulating material to form an essentially coplanar second surface with the contact pads exposed; and
forming interconnects between the plurality of separated regions of second conductivity type and contact pads in an adjacent row.

14. The method of claim 13 and further comprising:
forming electrical contacts to a back surface of the body of first conductivity type photodetector material prior to bonding the body to the first surface.

* * * * *